(12) United States Patent
Gluss et al.

(10) Patent No.: US 6,473,889 B1
(45) Date of Patent: Oct. 29, 2002

(54) METHOD OF AUTOMATICALLY GENERATING REPEATER BLOCKS IN HDL AND INTEGRATING THEM INTO A REGION CONSTRAINED CHIP DESIGN

(75) Inventors: Robert J. Gluss, Los Gatos, CA (US); Nicholas S. Fiduccia, Saratoga, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/562,591

(22) Filed: Apr. 29, 2000

(51) Int. Cl.[7] ............................................... G06F 17/50
(52) U.S. Cl. ..................... 716/8; 716/8; 716/9; 716/10; 716/11
(58) Field of Search ........................ 716/1–21; 700/86, 700/97; 702/65; 703/14, 15, 28; 712/208; 714/725

(56) References Cited

U.S. PATENT DOCUMENTS

| | | | | |
|---|---|---|---|---|
| 5,838,580 | A | 11/1998 | Srivatsa | 364/489 |
| 5,838,581 | A | 11/1998 | Kuroda | 364/491 |
| 5,960,191 | A | * 9/1999 | Sample et al. | 703/28 |
| 5,995,735 | A | 11/1999 | Le | 395/500.14 |
| 6,286,128 | B1 | * 9/2001 | Pileggi et al. | 716/18 |

* cited by examiner

*Primary Examiner*—Vuthe Siek
*Assistant Examiner*—Naum Levin

(57) ABSTRACT

A method of integrating repeaters into an integrated circuit design model includes specifying a geometry of a plurality of separate cell blocks. These cell blocks are locations on a chip die supporting appropriate functional capabilities, such as arithmetic and logic functions, decoders, input/output, etc. A list identifying top level nets connecting the cell blocks is then generated and locations along these top level nets exceeding a maximum signal transmission criteria (e.g., RC interconnect constraints) are identified. Repeater constraint regions are defined apart from the cell blocks and include one or more of the locations identified. A list is then generated of top level nets to be repeated at respective repeater constraint regions. An HDL representation is generated of repeater blocks for placement within each of the repeater constraint regions. Wiring directives may then be automatically generated connecting the HDL representation of repeater blocks into the integrated circuit design model. The HDL representation is compatible with multiple levels of abstraction representing the integrated circuit design model including a presynthesis model of an integrated circuit written, for example, in RTL. The HDL representation may further be compatible with a behavioral model of the integrated circuit design model. Each of the repeater constraint regions is sized and located to facilitate integrating repeaters into the pre-placement design. The size and location of the repeater constraint regions may further provide that the maximum signal transmission criteria (e.g., RC interconnect constraints) are satisfied independent of a functional cell placement within each of the cell blocks such that driving, receiving, and repeater cells can all be placed anywhere within respective constraint regions without violation of the maximum signal transmission criteria.

20 Claims, 4 Drawing Sheets

METHOD OF AUTOMATICALLY GENERATING REPEATER BLOCKS IN HDL AND INTEGRATING THEM INTO A REGION CONSTRAINED CHIP DESIGN

BACKGROUND

Most computer chips are designed as a set of functional blocks where each of the functional blocks implement some small portion of the chip's overall functionality. In a floor plan design, each block is designated to be contained within its own limited area on the chip or in the silicon, which is called a constraint region. Interconnects or nets typically join individual system components within the circuit. Intra-region local nets are relatively short and are typically implemented as simple wires and connect system components within a region. However, top level nets which span blocks or cells in different constraint regions can be quite long. For even a moderately sized integrated circuit (IC), a significant number of top level wires are necessary to join system components in different blocks. These wires, used to join system components within a single block or between blocks, are quite typically resistive and passive and therefore behave as resistive capacitive (RC) transmission lines. These RC transmission lines result in delay and rise times that both increase quadratically with wire length. The longer nets experience significant signal degradation.

To mitigate the RC effects, modern chips use active repeaters within long nets to regenerate the signal. An active repeater is typically implemented as a simple buffer or inverter. Effectively, the long wires or nets are split into shorter and nominally equal length segments which are joined by these repeaters. The overall delay of the wire segments and repeaters is significantly less than for the original long wire and the rise time of the destination is also greatly improved. Typically, nets which exceed the RC limit on direct connect distance need to be divided and a repeater inserted.

In the context of repeaters, there are at least three types of net topologies that need to be considered: point-to-point, multidrop and individually buffered multidrop. Point-to-point nets simply connect one cell's output with another cell's input, so repeating a long point-to-point net by breaking the net and inserting a repeater, is straightforward. Thus, a point-to-point net which exceeds the RC limit on direct connect distance is appropriately divided and one or more repeaters are added.

When one cell's output is sent to multiple destination cells a multidrop net is present. When a multidrop net exceeds the RC limit on direct connect distances, repeaters must again be used. There are two variations of repeaters within multidrop nets: shared buffer and individually buffered cases.

In a shared buffered multidrop, a single repeater is placed between a source cell's output and the point at which the wire diverges to its multiple destinations. In an individually buffered multidrop, each destination requires a dedicated repeater so that a repeater is inserted between the point at which the wire diverges to its multiple destinations and their respective destinations. Multidrop situations can be specified as either shared buffered or individually buffered situations dependent on the specific interconnect topology, the floor plan, and by the preference of the designer. Additionally, in some multidrop nets, both shared buffered and individually buffered techniques are used. For instance, if the distance from the output to the point at which the wire diverges exceeds the RC limit on direct connect distance, a shared buffer or repeater would be needed in that segment of the wire. Additionally, if each of the individual wires from where the single wire diverges to the specific destinations, each exceed the RC limit on direct connect distances, each of these lines will need to be individually buffered with a repeater. For top level nets which are greater than twice the RC limit direct connect distance, multiple repeaters may be required.

There are a number of steps required for integrating repeaters into a higher-level (e.g. Register Transfer Logic (RTL)) design. First, a list of top level nets which may require the addition of repeaters must be generated. Second, the top level nets identified must be examined to determine the location of the repeater block constraint regions. Repeater block constraint regions are regions in which the repeater could be located and which will reduce the effective wire lengths below the RC limit on direct connect distances. The type (point-to-point, shared buffer or individually buffered multidrop) of the repeater must then be determined. When a repeater is inserted within a top level net, the net itself must be split and new net names must be created for each new piece of the original top level net. Then, a hardware description language ( HDL) description for the repeater block must be created. Finally, the repeater block input/output (I/O) ports have to be accurately wired into the original HDL model. An HDL model is a method of describing functional circuits and interconnects. Each of these manual tasks is time consuming and quite error prone. Modifications to the circuit design may necessitate the revision of repeater blocks and/or their locations. Major design modifications may require regeneration and recalculation of repeater sites.

Prior repeater insertion scripts analyze the post-placement design and calculate the length of the nets to determine if a repeater is necessary. If a repeater is necessary, a repeater insertion scripts break the net and inserts a repeater. The scripts then repeat this examination focusing on the lengths of each section of the divided net to determine if additional repeaters are necessary.

Because such repeater insertion scripts have a simplistic and "after-the-fact" (i.e., post-placement approach to repeater insertion) this technique has failed to effectively locate repeater cells to provide repeatable, controlled results. Further, the repeater insertion scripts generally do not handle multidrop topologies adequately. Additionally, this cell-level design modification invalidates the standard RTL-level design based verification and requires a gate-to-RTL equivalency check whenever the repeaters are added or modified. The resulting manual effort can be substantial.

Accordingly, a need exists for a system which automatically determines the location of the repeater blocks without expending undue time or effort. A further need exists for the automatic generation of repeater blocks which is error free. A further need exists for an automated repeater determination tool which handles multidrop topologies. Still further, a need exists for an automatic repeater determination tool which will allow design modifications without requiring manual efforts to revalidate earlier identified repeater locations.

SUMMARY OF THE INVENTION

These and other objects, features and technical advantages are achieved by a system and method which according to an aspect of the invention, a method of integrating repeaters into an integrated circuit design model includes specifying a geometry of a plurality of separate cell blocks.

These cell blocks are locations on a chip die supporting appropriate functional capabilities, such as arithmetic and logic functions, decoders, input/output, etc. A list identifying top level nets connecting the cell blocks is then generated and locations along these top level nets exceeding a maximum signal transmission criteria are identified. Repeater constraint regions are defined apart from the cell blocks and include one or more of the locations identified. A list is then generated of top level nets to be repeated at respective repeater constraint regions.

According to a feature of the invention, a hardware description language (HDL) representation is automatically generated of repeater blocks for placement within each of the repeater constraint regions. Wiring directives may then be automatically generated connecting the HDL representation of repeater blocks into the integrated circuit design model.

According to another feature of the invention, the HDL representation is compatible with multiple levels of abstraction representing the integrated circuit design model including a presynthesis model of an integrated circuit written, for example, in RTL. The HDL representation may further be compatible with a behavioral model of the integrated circuit design model.

According to another feature of the invention, the a preferred repeater topology is specified which may define a fan-out characteristic of each of the top level nets. These fan-out characteristics may include (i) point-to-point, (ii) individually buffered multidrop, and (iii) shared multidrop connections or topologies.

According to another feature of the invention, each of the repeater constraint regions is sized and located to facilitate integrating repeaters into a pre-placement design. The size and location of the repeater constraint regions may further provide that the maximum signal transmission criteria (e.g., RC interconnect constraints) are satisfied independent of a functional cell placement within each of the cell blocks.

According to another feature of the invention, each of the repeater constraint regions is sized and located such that driving, receiving, and repeater cells can all be placed anywhere within respective constraint regions without violation of the maximum signal transmission criteria.

According to another feature of the invention, a hierarchical designation is assigned to each segment of the top level nets wherein each segment is defined by respective end nodes. Each of the top level nets may include a source node and at least one terminal node such that the hierarchical designation includes designating a corresponding one of the source nodes. According to an alternative definition, each of the top level nets include a source node and at least one terminal node and the hierarchical designation includes a source node designator. The hierarchical designation may include designation of a driving one of the repeaters located on a respective top level net immediately prior and directly coupled to a corresponding segment.

According to another aspect of the invention, a method of designing an integrated circuit includes generating a behavioral model of the integrated circuit and specifying a geometry of a plurality of separate cell blocks implementing the behavioral model. A list is then generated identifying top level nets connecting the cell blocks along with particular locations along those of the top level nets exceeding a maximum signal transmission criteria. Repeater constraint regions may then be identified. These repeater constraint regions are separate and apart from the cell blocks, each region including one or more of the locations exceeding the maximum signal criteria. For each of these repeater constraint regions, a list is generated of top level nets to be repeated at that constraint region. An HDL representation of repeater blocks for placement within each of the repeater constraint regions is generated and incorporated into the behavioral model.

According to a feature of the invention, each of the repeater constraint regions is sized and located to facilitate integrating repeaters into a pre-placement design and/or such that the maximum signal transmission criteria are satisfied independent of a functional cell placement, within each of the cell blocks.

According to another feature of the invention, each of the repeater constraint regions is sized and located such that driving, receiving, and repeater cells can all be placed anywhere within respective constraint regions without violation of maximum signal transmission criteria.

According to another feature of the invention, the behavioral model is written in RTL.

According to another feature, the invention includes the additional steps of generating an HDL representation of the cell blocks and combining the HDL representation of the cell blocks with the HDL representation of the repeater blocks to provide an HDL model of the integrated circuit. The invention may further include steps of generating a gate level representation of the integrated circuit from the HDL model of the integrated circuit and generating wiring directives based on the HDL model.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
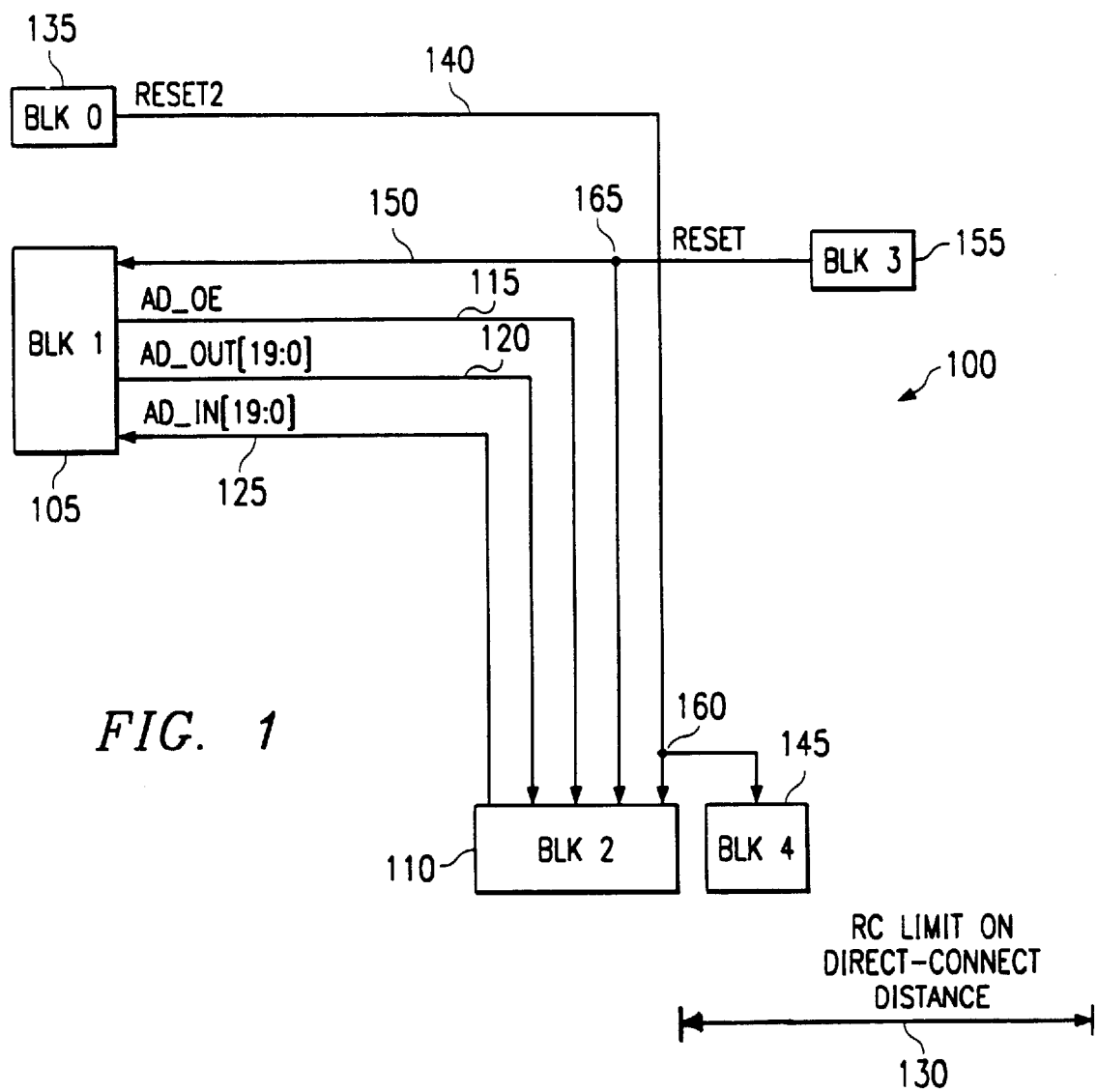
FIG. 1 shows a block diagram of a plane view of a circuit including cell areas and wires.

System 100 of FIG. 1 is a floor plan of a chip die which includes five constraint region locations and top level interconnects or nets between the appropriate cells within those regions. Three different sets of wires run between BLK1 (105) and BLK2 (110). Wire AD—OE (115), bus AD—OUT (120) and bus AD—IN (125) each run between BLK1 (105) and BLK2 (110). On the bottom right of FIG. 1 is the length of the RC limit on direct connect distance 130. The length of all wires between BLK1 (105) and BLK2 (110) exceeds the RC limit on direct connect distance 130. Therefore, each of these wires will require the addition of a repeater. Each of these wires is defined as a point-to-point net.

Within system 100 of FIG. 1 there are also two multidrop nets. The output 140 of BLK0 (135), labeled RESET2, runs down to both BLK2 (110) and BLK4 (145). The second multidrop net is shown with the output 150, labeled RESET, of BLK3 (155) which runs to both BLK2 (110) and also to BLK1 (105). BLK0 135's RESET2 output 140 exceeds the RC limit on direct connect distance 130 and requires at least one repeater be inserted within output RESET2 (140). However, because of the location of the split of output RESET2 (140) near the end of the wire (160), shared repeaters may be used within this line. This is an example of a shared buffer multidrop network. Additionally, more than one repeater will be required within this net since the output RESET2 (140) is more than twice the length of the RC limit on direct connect distance 130.

BLK3 155's output RESET (150) is divided into two separate lines at a length which is less than the RC limit on direct connect distance 130. However, if a single repeater is inserted at the split and the repeater output is wired to both destinations, there is no guarantee that the wiring tool will yield a result that doesn't exceed the RC limit (130). Therefore each of these lines will require its own repeater. This is an example of an individually buffered multidrop network.

Figure 2:
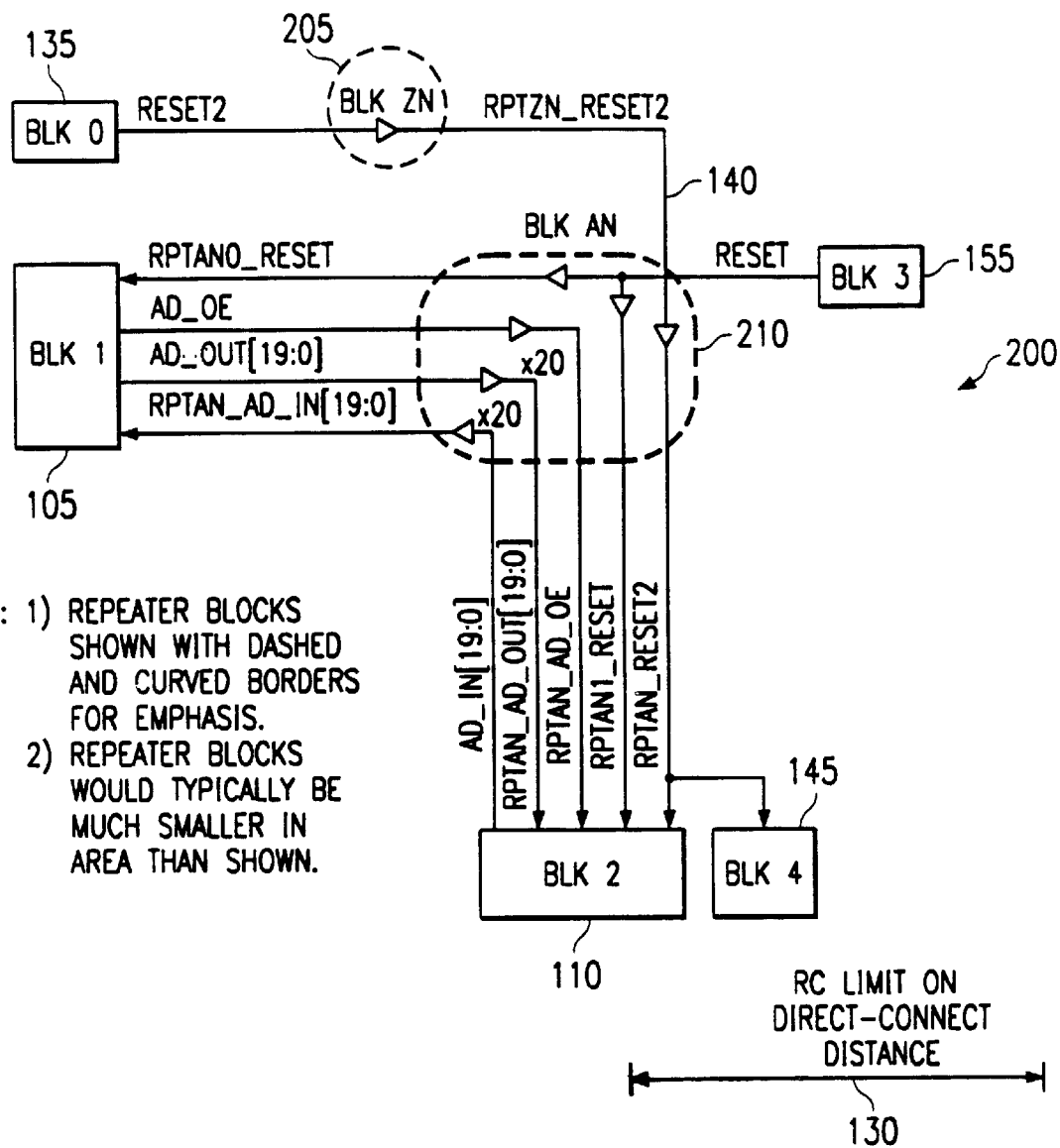
FIG. 2 shows the block diagram of FIG. 1 with repeater block constraint regions.

System 200 of FIG. 2 shows the insertion of repeater block constraint regions for the repeaters required for the top level nets as discussed with respect to FIG. 1. Region BLKZN (205) identifies an area in which a repeater will be placed in output RESET2 (140) of BLK0(135). BLK0(135) defines a chip die region in which the driving cell may be placed and not an exact location. If the cell residing within BLK0(135) were aligned along the left edge of BLK0, the length of the resulting wire leaving the cell would be greater than the output RESET2 wire 140 shown in the diagram. Alternately, if the cell located within BLK0 (135) were aligned with the right-hand edge of BLK0, the RC limit on direct connect distance 130 would allow the repeater to be placed further along the output line RESET2 (140) than if the cell were located on the left-hand edge of BLK0 (135). Since this method is applicable to pre-placed designs, the size and location of the repeater constraint region are specified such that any placement of drive, receive, and repeater cells within their respective constraint regions is within the RC limit or interconnect distance (130). Additionally, a designer may wish to place the repeater at a distance length less than the RC limit on direct connect distance to allow for a safety margin to assure the repeater's efficient operation.

As discussed with reference to FIG. 1, six additional repeater groups were identified in the top level nets which connected BLK1 (105), BLK3 (155), BLK2 (110) and BLK4 (145). This new repeater block constraint region is defined as BLKAN (210).

When repeaters are used within nets, the nets must be split and new net names must be created for each portion of the original top level net. For instance, RESET2 used to define the wire which ran from BLK0 (135) and ran down to both BLK2 (110) and BLK4 (145). However, with the addition of a repeater within the repeater region BLKZN (205) and the addition of a second repeater within the repeater region BLKAN (210) the top level net must be broken up into three separate segments. The first wire segment from BLK0 (135) to BLKZN (205) can retain the net name RESET2. The portion of the net residing between BLKZN (205) and BLKAN (210) cannot retain the name of RESET2 because this name would conflict with the name of the portion of the net between BLK0 (135) and BLKZN (205). In the preferred embodiment of the invention, the net name for this portion of the top level net is a concatenation of the repeater site which was introduced into the top level net and the original net name. In this case using the name of the repeater introduced within repeater region BLKZN, the net between BLKZN (205) and BLKAN (210) has been designated RPTZN—RESET2. Similarly, a portion of the top level net between BLKAN (210) and BLK2 (110) and BLK4 (145) also has to be renamed. Maintaining consistency in our nomenclature, this segment of the top level net would be designated RPTAN—RESET2. The retention of the RESET2 suffix in the names of the new portions of the top level net running from BLK0 to BLK2 and BLK4 allows the system to retain the relationship between the various segments of the original net. To summarize, the portions of the top level net are named as follows: first start at the originating cell, in this case BLK0 (135). The portion of the net in the originating cell to the first repeater retains the name of the original net, in our example RESET2. Once passed the first repeater site the name of the portion of the net that runs from the first repeater site down to either the next repeater site or the destination is a concatenation of the name of the first repeater site and the original net name, in this case RPTZN—RESET2. If another repeater site is located in the line, the name of that portion of the net is determined in a similar manner. Thus, the new net's name is the name of the repeater site followed by the original net name. For the portion of the net between BLKAN (210) and BLK2 (110) and BLK4 (145) it would be RPTAN—RESET2.

In a similar manner, all of the other portions of the nets depicted in FIG. 2 are named. For instance, the first segment of the top level net running from BLK3 (155) to BLK1 (105) retains the name RESET. Once the first repeater site is encountered the name of the portion of the net which connects the repeater site with the destination BLK1 (105) is determined by the concatenation of the repeater site plus the original name. Normally the name of this portion would be RPTAN—RESET. However, in the case of an individually buffered multidrop a distinction must be made between the legs. Therefore, this segment of the net is labeled RPTAN0—RESET. For the portion of the top level net that runs from the repeater's range BLKAN (210) to BLK2 (110) the name again is a concatenation of the repeater site plus the original net name. Normally this would be RPTAN—RESET. However, since this portion of the net is associated with an individually buffered multidrop the name is changed to RPTAN1—RESET. The net names from BLK1 (105) to BLK2 (110) are determined similarly.

Figure 3:
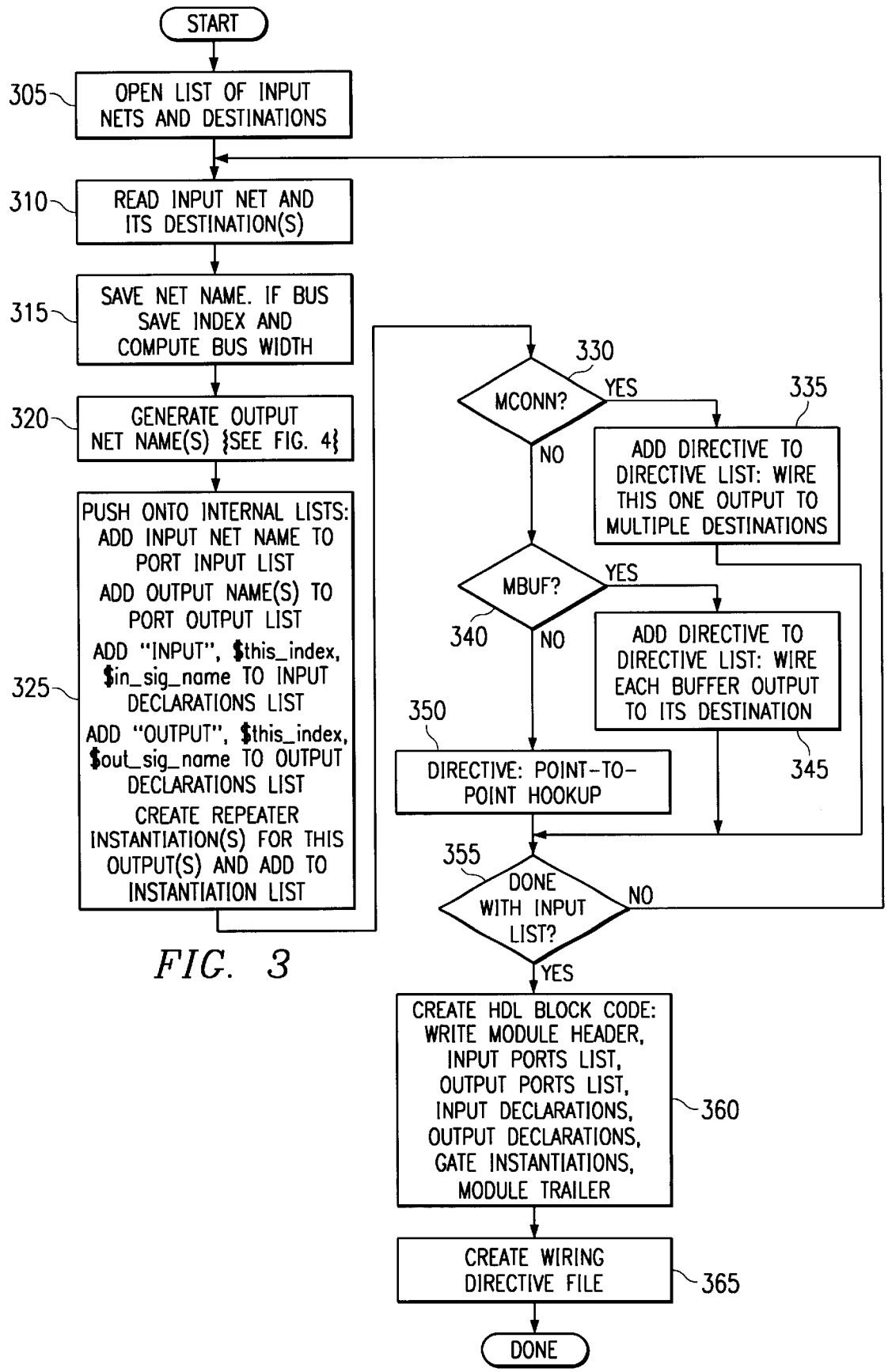
FIG. 3 shows a flow diagram of the preferred embodiment of the present invention.

Referring now to FIG. 3, the preferred embodiment of the invention can be described through the use of a flow chart. As previously discussed, a list of top level nets is generated which includes all top-level nets to be repeated at this particular repeater block, their destinations, and their optional multidrop specifiers. In Step 305 of the flow chart, this list is accessed. In Step 310, a top level net along with its destinations and multidrop specifier, if included, are read. In Step 315, the net name is saved. In Step 320, the program generates the output net name(s). This process will be further discussed with FIG. 4. The program itself uses five internal lists. So Step 325 adds the input net name to the port input list, adds the output name(s) to the port output list, adds a modification of the input to the input declaration list, and adds the modification to the output to the output declaration list. Step 325 also creates the repeater instantiations for this output and adds those to the instantiation list.

In Step 330, the program looks to see if there are multiple connections on the output of this net to determine if this net constitutes a shared buffer multidrop net. If the answer to this question is yes in Step 335, the directives are added to the directive list directing that this output be wired to each of its multiple destinations. In Step 340, the program looks to see if multiple buffers are required in an individually buffered multidrop net. If the answer to this question is yes, the directive is added to the directive list that each buffer output is wired to its destination in Step 345. If a net does not involve multidrop nets, the net is a point-to-point net and dealt with accordingly in Step 350. The preceding Steps 310 through 350 are repetitively performed until all of the entries in the input list are dealt with. Step 355 checks to ensure that each of the entries in the input list have been examined. If there are additional entries in the input list, the process is repeated from Step 310. In Step 360, the HDL block code is generated. Finally, in Step 365, the wiring directive file is created.

Figure 4:
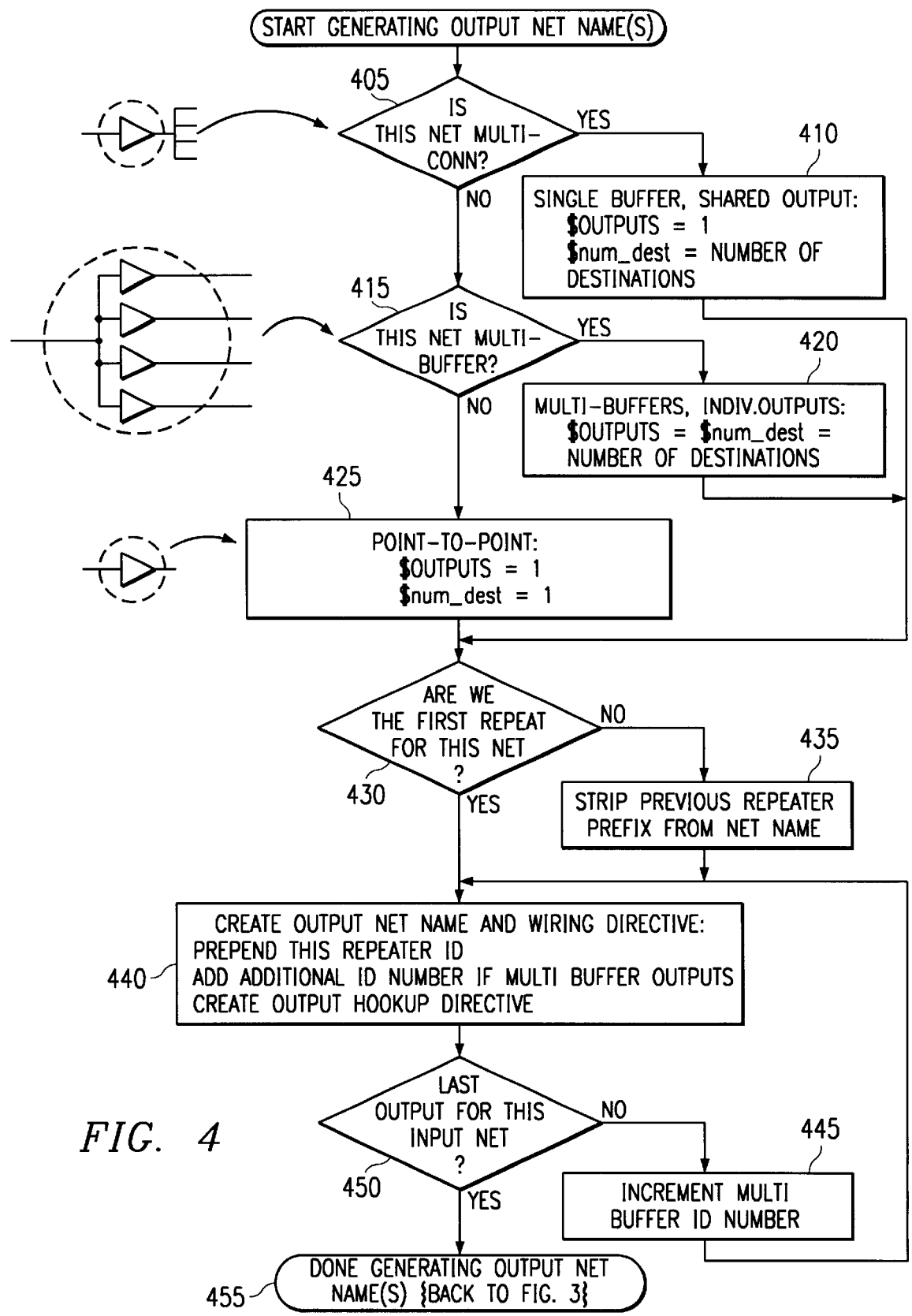
FIG. 4 shows a flow diagram for naming the resulting net segment when repeaters are added.

FIG. 4 depicts the preferred embodiment which utilizes a systematic method for generating the output net names. In Step 405, if this is a multidrop net that we are examining, and it has a shared buffer, the criteria for determining the output net names are generated in Step 410. If, however, we are dealing with a multidrop individually buffered net, Step 415 makes this determination and in Step 420 the criteria for determining names of these net outputs are generated. Step 425 generates the criteria for determining the output net names for point-to-point net. Step 430 is used to determine if this is the first repeating of this net. If the answer to this question is no, in Step 435 the previous repeater prefix is removed from the net name. If the answer to the question asked in Step 430 is yes, Step 440 creates the output net name and the wiring directive. Finally, Step 450 looks to see if this was the last output for this input net. If the answer is no, the program proceeds to Step 445 to increment a multibuffer ID number. If the answer to the question asked in Step 450 is yes, all of the output net names have been generated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of integrating repeaters into an integrated circuit design model, comprising the steps of:
   specifying a geometry of a plurality of separate cell blocks;
   generating a list identifying top level nets connecting said cell blocks;
   identifying locations along those of said top level nets exceeding a maximum signal transmission criteria;
   defining repeater constraint regions apart from said cell blocks and including one or more of said locations identified by said identifying step;
   generating, for each of said repeater constraint regions, a list of those top level nets to be repeated at that constraint region.

2. The method according to claim 1 further comprising a step of automatically generating an HDL representation of repeater blocks for placement within each of said repeater constraint regions.

3. The method according to claim 2 further comprising a step of automatically generating wiring directives connecting said HDL representation of repeater blocks into the integrated circuit design model.

4. The method according to claim 2 wherein said HDL representation is compatible with multiple levels of abstraction representing the integrated circuit design model.

5. The method according to claim 2 wherein said HDL representation is compatible with a presynthesis model of an integrated circuit.

6. The method according to claim 5 wherein said presynthesis model is written in RTL.

7. The method according to claim 2 wherein said HDL representation is compatible with a behavioral model of the integrated circuit design model.

8. The method according to claim 1 further comprising a step of specifying a preferred repeater topology.

9. The method according to claim 8 wherein said step of specifying a preferred repeater topology includes defining a fan-out characteristic of each of said top level nets.

10. The method according to claim 9 wherein said step of defining a fan-out characteristic of each of said top level nets includes specifying each of said top level nets to have one of a (i) point-to-point, (ii) individually buffered multidrop, and (iii) shared multidrop topology.

11. The method according to claim 1 wherein each of said repeater constraint regions is sized and located to facilitate integrating repeaters into a pre-placement design.

12. The method according to claim 1 wherein each of said repeater constraint regions is sized and located such that said maximum signal transmission criteria are satisfied independent of a functional cell placement within each of said cell blocks.

13. The method according to claim 12 wherein said maximum signal transmission criteria include RC interconnect constraints.

14. The method according to claim 1 wherein each of said repeater constraint regions is sized and located such that driving, receiving, and repeater cells can all be placed anywhere within respective constraint regions without violation of said maximum signal transmission criteria.

15. The method according to claim 14 wherein said maximum signal transmission criteria include RC interconnect constraints.

16. The method according to claim 1 further comprising a step of assigning a hierarchical designation to each segment of said top level nets wherein each segment is defined by respective end nodes.

17. The method according to claim 16 wherein each of said top level nets include a source node and at least one terminal node, and said step of assigning a hierarchical designation includes designating a corresponding one of said source nodes.

18. The method according to claim 16 wherein each of said top level nets include a source node and at least one terminal node and said hierarchical designation includes a source node designator.

19. The method according to claim 18 wherein said hierarchical designation further includes designation of a driving one of said repeaters located on a respective top level net immediately prior and directly coupled to a corresponding segment.

20. A method of designing an integrated circuit, comprising the steps of:

generating a behavioral model of the integrated circuit;

specifying a geometry of a plurality of separate cell blocks implementing said behavioral model;

generating a list identifying top level nets connecting said cell blocks;

identifying locations along those of aid top level nets exceeding a maximum signal transmission criteria;

defining repeater constraint regions apart from said cell blocks and including one or more of said locations identified by said identifying step;

generating, for each of said repeater constraint regions, a list of those top level nets to be repeated at that constraint region;

generating an HDL representation of repeater blocks for placement within each of said repeater constraint regions; and incorporating said HDL representation of repeater blocks into said behavioral model.

* * * * *